United States Patent [19]

Tomazic

[11] Patent Number: 5,459,390
[45] Date of Patent: Oct. 17, 1995

[54] METHOD OF DETERMINING THE CHARGING STATE OF A ZINC-BROMINE BATTERY AND METHOD OF CHARGING SUCH BATTERY

[75] Inventor: Gerd Tomazic, Murzzuschlag, Austria

[73] Assignee: Elin Energieanwendung GmbH, Vienna, Austria

[21] Appl. No.: 185,223

[22] Filed: Jan. 24, 1994

Related U.S. Application Data

[63] Continuation of Ser. No. 887,048, May 22, 1992, abandoned.

[30] Foreign Application Priority Data

May 24, 1991 [AT] Austria ................................. 1061/91

[51] Int. Cl.⁶ ..................................................... H02J 7/00
[52] U.S. Cl. ................................ 320/30; 320/32; 320/35; 320/36
[58] Field of Search ................................ 320/7, 30, 32, 320/33, 35, 36, 39, 44

[56] References Cited

U.S. PATENT DOCUMENTS

| | | | |
|---|---|---|---|
| 4,016,474 | 4/1977 | Mason | 320/15 |
| 4,028,616 | 6/1977 | Stevens | 320/48 |
| 4,105,829 | 8/1978 | Venero | 429/15 |
| 4,484,130 | 11/1984 | Lowndes et al. | 320/40 |
| 4,615,108 | 10/1986 | Tomazic | 29/623.2 |
| 4,616,170 | 10/1986 | Urgstöger | 320/5 |
| 4,691,158 | 9/1987 | Hashimoto et al. | 320/14 |
| 4,745,349 | 5/1988 | Palanisamy et al. | 320/22 |
| 4,766,045 | 8/1988 | Bellows et al. | 429/105 |
| 4,803,416 | 2/1989 | Abiren et al. | 320/44 |
| 4,818,642 | 4/1989 | Bellows et al. | 429/105 |
| 4,820,965 | 4/1989 | Siemer | 320/31 |
| 4,876,495 | 10/1989 | Palanisamy et al. | 320/18 |
| 5,061,578 | 10/1991 | Kozuma et al. | 429/3 |
| 5,160,880 | 11/1992 | Palanisamy | 320/32 |
| 5,177,425 | 1/1993 | Goto | 320/6 |

FOREIGN PATENT DOCUMENTS

| | | | |
|---|---|---|---|
| 0135056 | 3/1985 | European Pat. Off. | H01M 10/44 |
| 0149448 | 7/1985 | European Pat. Off. | H01M 10/04 |
| 0167517 | 1/1986 | European Pat. Off. | H01M 10/36 |
| 0168377 | 1/1986 | European Pat. Off. | H01M 10/36 |
| 0207057 | 12/1986 | European Pat. Off. | H01M 2/40 |
| 0223768 | 5/1987 | European Pat. Off. | B29C 65/42 |
| 0225315 | 6/1987 | European Pat. Off. | H01M 2/18 |
| 0228361 | 7/1987 | European Pat. Off. | H01M 2/40 |
| 0277937 | 8/1988 | European Pat. Off. | H01M 10/44 |
| 0291496 | 11/1988 | European Pat. Off. | H01M 4/02 |
| 0327528 | 8/1989 | European Pat. Off. | H01M 12/08 |
| 0343144 | 11/1989 | European Pat. Off. | H01M 10/48 |
| 0434659 | 6/1991 | European Pat. Off. | H01M 12/08 |
| 0438044 | 7/1991 | European Pat. Off. | H01M 12/08 |
| 0479765 | 4/1992 | European Pat. Off. | B29C 65/02 |
| 2028117 | 12/1970 | Germany | H01M 10/44 |
| 3811371 | 10/1989 | Germany | H01M 10/44 |

*Primary Examiner*—Thomas M. Dougherty
*Attorney, Agent, or Firm*—Sandler, Greenblum & Bernstein

[57] ABSTRACT

The method of determining the charging state of a rechargeable zinc-bromine battery which contains a plurality of series connected bipolar electrodes and circulating aqueous electrolytes, wherein oxidized bromine ions in conjunction with a complexing agent dissolved in aqueous electrolyte form a complex which is essentially insoluble in the electrolyte and zinc is separated at the electrode, and wherein a respective diaphragm is arranged between electrode chambers, entails determining the electrical voltage of one or a number of cells connected in series, especially during a predetermined removal of current per predetermined time interval, and evaluating the determined electrical voltage, especially indicating or displaying the same.

16 Claims, 3 Drawing Sheets

METHOD OF DETERMINING THE CHARGING STATE OF A ZINC-BROMINE BATTERY AND METHOD OF CHARGING SUCH BATTERY

This application is a continuation of application Ser. No. 07/887,048, filed May 22, 1992, now abandoned.

BACKGROUND OF THE INVENTION

1. Field of the Invention

The present invention relates to a new and improved method of determining the charging state of a zinc-bromine battery which contains a plurality of series connected bipolar electrodes and circulating aqueous electrolytes, and further relates to a new and improved method of charging such battery.

2. Discussion of the Background and Material Information

During the storage of energy the charging state of the storage battery or accumulator is just as decisive as the capacity of the storage battery. Only when there can be exactly determined the charging state is it also possible to use the entire capacity of the storage battery.

In the most widely used storage batteries or accumulators for electrical energy, namely, the lead-sulfuric acid batteries, there is usually measured the density of the electrolyte, and thus, there is determined the charging state of the battery. This density measurement is accomplished by removing a partial quantity of electrolyte from the battery and then there is performed hydrometry. This technique is unsuitable for the continuous control of the charging state.

From the text book "Blei- und Stahlakkumulatoren", authored by Erich Witte, 3rd. Edition, Otto Krausskopf publishers, Mainz, Germany, 1967, pages 61 to 63, there is taught the use of a discharge indicator for lead batteries, wherein there is carried out a combined current and voltage measurement. During the current measurement there is used an adjustable shunt resistance. As disclosed in this publication, the determination of the voltage value in the static or quiescent state is distorted due to the combined current and voltage measurement, and furthermore, as is the capacity determination upon reaching a state of approximately 50% discharge. Therefore, the calibration of the indicator instrument as a percentage of the charging state is of only subordinate value since the displayed measurement data are too unreliable.

The electrical potential or voltage of a galvanic element is determined from the potential which is defined by the electrochemical series. However, if two or more oxidation stages exist within the battery, then it is possible for there to arise hybrid potentials of the different oxidation stages. In the case of the lead-sulfuric acid battery, in the charged state thereof, lead peroxide is present at the positive electrode and lead at the negative electrode. Sulfuric acid serves as the electrolyte. During discharge, the tetravalent ions of the lead peroxide are transformed into bivalent ions, and specifically into lead sulfate. At the same time, the metallic lead at the other electrode is likewise transformed into lead sulfate. The potential or voltage at the positive electrode is now dependent upon the concentration of the tetravalent and the bivalent lead ions, and the potential at the negative electrode only upon the concentration of the bivalent lead ions with excess metallic lead. The concentration of the tetravalent ions drops with increasing discharge, whereas, related to the bivalent lead ions, there is present a saturated lead sulfate solution. If there has been consumed the solid, that is, the lead peroxide separated out at the electrode, then the potential rapidly drops to extremely small values, in other words, in the final phase the total voltage or potential drops during discharge of the battery. For determining the charging state of the battery, especially when it has a higher or increased charging state, for instance, where the battery is charged to 80% or 90%, the potential or voltage thus can not serve as an indication or reading. Furthermore, for setting the actual voltage there is required a great deal of time, so that the voltage measurement provides no real value as concerns the capacity of the battery.

In German Published Patent No. 2,028,117, published Dec. 23, 1970, there is disclosed an apparatus for controlling a charging device apparently for a lead accumulator. During charging the actual accumulator voltage is stored in an analog storage or memory. After a predetermined time interval, for example, one-tenth of a second, the actual accumulator voltage is compared with the previously measured value. If there is not present any increase in voltage or potential, then there is interrupted the connection to the charging device. In order to measure the accumulator voltage the charging current voltage must be less than the actual voltage of the accumulator, in order that the measured voltage value does not correspond to that of the charging current source.

From the commonly assigned European Patent No. 0,149,448, published Jul. 24, 1985, there is known a zinc-bromine battery with circulating electrolytes. The electrochemical processes which occur during discharge are such that, on the one hand, metallic zinc goes into solution from the electrode as bivalent zinc bromide and, on the other hand, molecular bromine is converted to bromine ions. The concentration of the zinc and the bromine is constant since, on the one hand, metallic zinc is present at the electrode and, on the other hand, merely because of the equilibrium between a bromine complex and the aqueous electrolyte the bromine concentration is predetermined. Also, equally for the zinc there are present only two forms, namely the zerovalent and bivalent zinc and equally for bromine the zerovalent and monovalent bromine ions.

The bromine complex is difficult to dissolve in water, whereas the complexing agent is dissolved in aqueous electrolytes. The quantity of the difficult to dissolve bromine complex thus constitutes a direct measuring value of the charging state of a zinc-bromine battery of the aforementioned construction. Since the bromine complex has a greater density than water, it separates out or deposits at the floor of an electrolyte container or receptacle. By determining the filling level or height there can be ascertained the charging state of the battery. Considerable errors arise if there is not taken into account the temperature of the electrolyte, since owing to the increase in volume at increased temperatures, or the decrease in volume at lower temperatures, there must be taken into account an additional magnitude. A further disturbance factor, although not present with stationary batteries but, however, with mobile batteries, as such is the case, for example, when used in motor vehicles, resides in the fact that during measurement of the filling level the container or receptacle should be horizontally positioned. If this position does not exist, then, depending upon the inclination of the electrolyte container and the arrangement of the float serving for the filling level measurement, there can be indicated a too low or a too high charging state. Furthermore, the accuracy of such indicator is dependent upon the configuration of the electrolyte container. The smaller the base surface and the greater the height of the electrolyte container that much more accurate becomes the indication or reading. However, with batteries used in mobile environments, the requirement exists that the batteries should be designed to be as flat as possible, and therefore also the electrolyte container or receptacle, so that such filling level measurements are associated with considerable inaccuracies.

SUMMARY OF THE INVENTION

Therefore, with the foregoing in mind, it is a primary object of the present invention to provide an improved method of determining the charging state of rechargeable zinc-bromine batteries, which is independent of the geometry design of the electrolyte container or reservoir and does not require mechanical devices, such as hydrometers, floats and the like.

Another noteworthy object of the present invention aims at providing an improved method of determining the charging state of a zinc-bromine battery which contains a plurality of series connected bipolar electrodes and circulating aqueous electrolytes, in a manner not afflicted with the aforementioned limitations and drawbacks of the prior art, and further relates to an improved method of charging such battery.

Now in order to implement these and still further objects of the present invention, which will become more readily apparent as the description proceeds, the method of the present development for determining the charging state of a zinc-bromine battery which contains a plurality of series connected bipolar electrodes and circulating aqueous electrolytes, wherein the oxidized bromine ions in conjunction with a complexing agent dissolved in aqueous electrolyte form a complex which is difficult to dissolve in the electrolyte and zinc is separated at the electrode and a diaphragm or separator is arranged in each case between the electrode spaces or chambers, essentially is manifested by the features that the electrical voltage or potential of one or a number of series connected cells, especially for a predetermined current removal per predetermined time interval, is determined and evaluated, especially displayed or indicated.

In a zinc-bromine battery containing circulating electrolytes and a complexing agent for the molecular bromine, during the entire charging operation and discharging operation the activity of both the zinc and the bromine is constant. The internal resistance of the battery, in particular the conductivity of the electrolyte, alters as a function of the zinc ion concentration. The greater the discharge of the battery the greater the amount of metallic zinc which is released from the electrode and the greater the amount of bromine which is reduced to bromine ions, so that the concentration of the zinc ions and the bromine ions in the electrolyte increases. On the other hand, what remains constant is the concentration of the additives in the electrolyte, such as, for example, conductive salts, which are merely added in order to increase the conductivity of the electrolyte. Furthermore, the electrolyte is formed by an emulsion which is formed from the aqueous electrolyte and the bromine complex which is essentially insoluble in water. The relatively insoluble bromine complex now covers part of the electrode and also the diaphragm or separator, so that the effective cross-section for the passage of the current is reduced, resulting in an increase in the electrical resistance of the cell. Notwithstanding the mutually superimposed or augmenting effect, the voltage or potential of the battery increases with increasing charging and decreases with decreasing charging state or condition.

If there is determined directly prior to the voltage or potential measurement whether current has been delivered to or drawn from the cell, then there can be carried out a particularly accurate capacity determination, since with a predetermined charging capacity there are present slight differences in the voltage of the battery depending upon whether there is accomplished charging or discharging.

If the electrical voltage or potential and/or a digital value thereof, is compared with a previously determined value and the thus determined absolute and/or relative stored amount of current of the battery indicated, then by means of a particularly simple comparative measurement there can be determined the capacity. At the same time there also can be taken into account, in a particularly simple manner, the momentary particular or specific properties of the battery, the electrolyte, the electrodes, the diaphragm and the like.

If the determination of the voltage is undertaken during changes in the current removal at a predetermined current capacity removal by the operating loading or duty, then the capacity determination of the battery occurs in each case at an increased or decreased current removal which can bring about appreciable changes in the capacity, so that it is not possible to fix by means of a timing element the intervals of the capacity determination, rather such is carried out in correspondence with the loading of the battery.

In order to increase the accuracy of the capacity determination of the battery there also can be determined the temperature of the electrolyte, so that for the determination of the capacity of the battery there is performed a comparison with corresponding voltage values at the corresponding temperatures.

Continuing, it is here further pointed out the inventive method of charging a zinc-bromine battery containing circulating electrolytes, series connected cells separated by diaphragms or separators, bipolar electrodes, and wherein the oxidized bromine in conjunction with a complexing agent dissolved in aqueous electrolyte forms an essentially water insoluble complex, is essentially manifested by the features that there is measured the voltage of the zinc-bromine battery during a charging pause and the measured voltage or measurement result is compared with a predetermined or set value and upon reaching or exceeding such predetermined or set value there is interrupted current infeed.

Stated in an other way, there is provided a novel method of charging a zinc-bromine battery of the aforementioned type, which contemplates the steps of charging the zinc-bromine battery, measuring the voltage of the zinc-bromine battery during a charging pause to obtain a measurement result, comparing such measurement result with a predetermined value, and interrupting current infeed upon reaching or exceeding such predetermined value.

By virtue of this procedure there is obtained a particularly simple charging method, and at the same time there can be prevented overloading of the battery due to current infeed when the battery already has been electrochemically completely or fully charged. As a result, there do not occur any undesired thermal loading or decomposition of constituents of the electrolyte caused by excess voltages or potentials.

A particularly advantageous method of charging a zinc-bromine battery then can be realized if, upon dropping below a predetermined voltage value, there is connected a charging current source to the battery upon completion or termination of current removal.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Describing now the drawings, it is to be understood that only enough of the construction of the battery and associated equipment have been depicted therein, in order to simplify the illustration, as needed for those skilled in the art to readily understand the underlying principles and concepts of the present invention.

The zinc-bromine battery employed in the exemplary embodiments is of conventional construction and is of the type comprising bipolar electrodes formed of plastic-bound carbon. The outer edges of the electrodes are devoid of carbon and thus are electrically insulating. These outer regions are connected with diaphragms or separators arranged in spaced relation from conductive regions of the electrodes. A multiplicity of electrodes are series connected. The anode- and cathode spaces or chambers have flowing therethrough a circulating electrolyte moving through a fluid parallel circuit. The removal of the electrolyte is analogously accomplished. At the corresponding ends of the battery there are provided electrical conductors or terminals or the like for rendering possible current removal from or charging of the battery, as the case may be. Basically, such type zinc-bromine battery has been disclosed in greater detail in the aforementioned commonly assigned European Patent No. 0,149,448, published Jul. 24, 1985, to which reference may be readily had and the disclosure of which is incorporated herein in its entirety by reference.

The electrolyte used with the non-charged battery has the following composition:

3 moles zinc bromide and 1 mole morpholinium bromide per liter of water.

Apart from, for example, morpholinium there also can be used as the complexing agent quaternary ammonium salts, such as pyrrolidinium salts and the like. During charging of the battery there is separated out at the electrodes a zinc film and elementary bromine, respectively. An oily phase is formed by the elementary bromine in conjunction with the complexing agent dissolved in the aqueous phase. This oily phase is heavier than the aqueous electrolyte and is essentially insoluble therein. A suspension is thus formed. Due to the circulated electrolyte the heavy complex is also conveyed out of the electrode spaces. Simultaneous with the charging of the battery there is present at the surface of the electrode a random separation of the bromine complex which is electrically insulating. A part of the bromine complex also has been deposited at the diaphragm, so that the internal resistance of the cell during charging has thus been increased.

Figure 1:
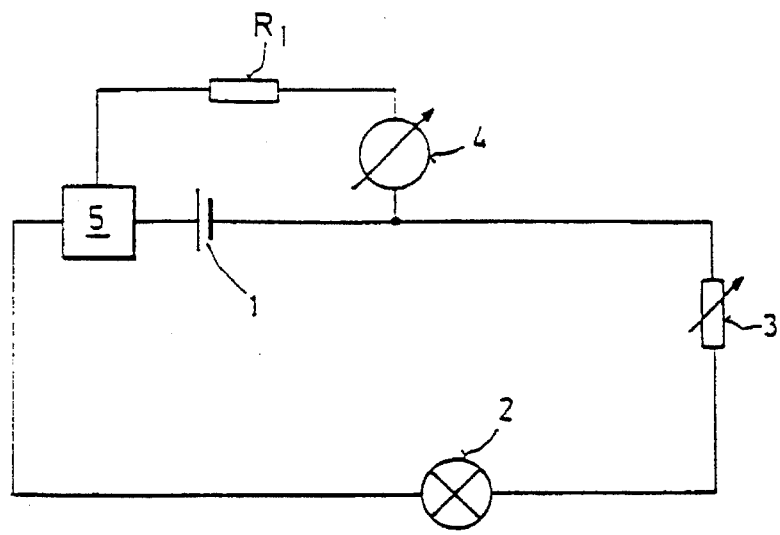
FIG. 1 schematically illustrates a block circuit diagram for measuring voltage or potential at predetermined loads.

In the block circuit diagram of FIG. 1 a consumer or load 2 is connected in circuit with the zinc-bromine battery 1. The consumption or take-up of current by the consumer or load 2 is regulated by power regulator 3. A voltmeter 4 or the like is connected in parallel with the consumer or load 2, and the current circuit to this voltmeter 4, containing the resistor or resistance $R_1$, can be opened and closed by means of a switch 5 comprising, for instance, a suitable timing element. Instead of such timing element or timer there also can be used a switch which closes the current circuit to the voltmeter 4 in the presence of a predetermined load and also, for instance, when there is no load, so that, for example, whenever there is present a changing loading of the circuit there is determined the voltage of the battery, and thus, the capacity thereof. The signal delivered by the voltmeter 4 can be displayed or indicated either in analog or digital fashion. If there is used, for instance, an analog display or indicator there can be displayed or indicated the capacity of the battery instead of the voltage. However, there also exists the possibility of comparing the signal delivered by the voltmeter 4 with a similar series of comparative measurements and to then indicate the still available battery capacity. Owing to the different mobility of the ions as a function of temperature, there is present a dependency with respect to the temperature of the electrolyte, it is thus also possible to additionally take into account the electrolyte temperature.

The circuit depicted in FIG. 1 can be employed, for instance, during the mobile use of zinc-bromine batteries as such are preferred for electrically powered vehicles.

Figure 2:
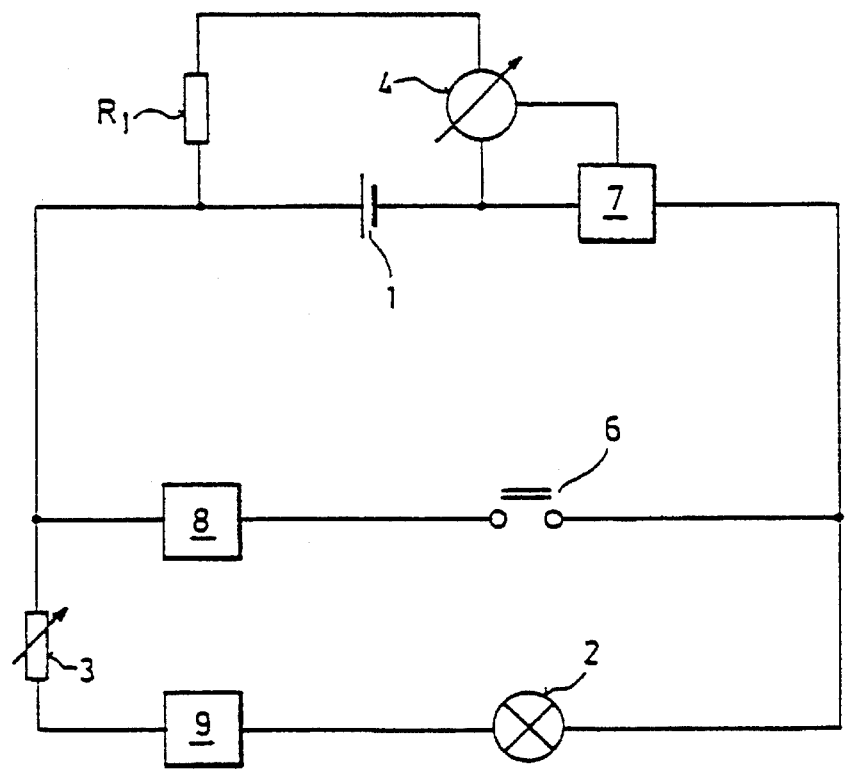
FIG. 2 schematically illustrates a block circuit diagram for measuring voltage or potential during charging of the battery.

In the circuit arrangement of FIG. 2 the voltmeter 4 is connected in parallel with the consumer or load 2 and the charging current source 6. By means of switch 7 this voltmeter or voltage measuring device 4 is switched-in at a predetermined range of loading of the battery 1 by the consumer or load 2. This loading range can be very low, for example, can amount to null. If the consumer or load 2 does not draw any current, then a switch 9 interrupts the current circuit to the battery 1. At the voltage measuring and switching element there is measured, with a certain time delay, the voltage or potential of the battery 1 and upon falling beneath a predetermined value voltage source 6 is connected by means of switch 8 with the battery 1 in order to charge the latter. Such switching operation can be carried out, for instance, during the mobile employment of batteries in order to charge the same during a speed reduction of the vehicle, in other words, during a useful or effective braking action. Such switching operation is, however, also useful in conjunction with stationary batteries if there should be ensured at all times a predetermined charging state or condition of these stationary batteries.

Figure 3:
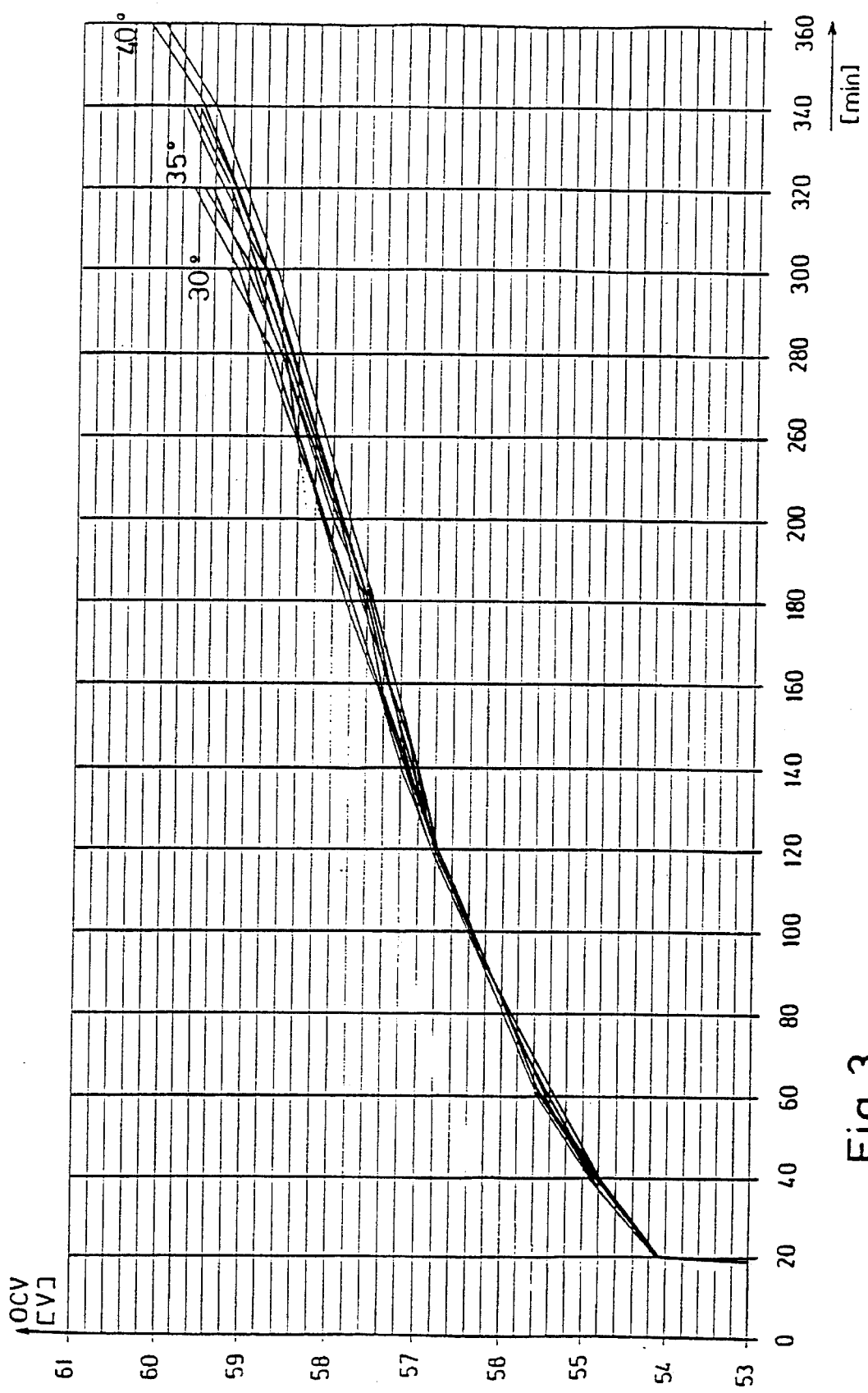
FIGS. 3 are 4 are respective diagrams illustrating the dependency of the voltage or potential upon charging state of the battery.

The diagram of FIG. 3 portrays the charging of a zinc-bromine battery with a constant current of 25 amperes. At a temperature of 30° C. of the electrolyte the final charging state is attained after approximately 300 minutes, and the voltage of the battery, measured with a loading of 0.3 amperes, amounts to 59.2 volts. At a temperature of the electrolyte of 35° C. there is obtained the final charging state after 320 minutes with a charging current of 25 amperes, and here the voltage amounted to 59.7 volts measured at a current of 0.3 amperes. At a temperature of the electrolyte of 40° C. there is obtained the complete charging state after approximately 360 minutes, and the voltage amounted to 60.1 volts measured at a current of 0.3 amperes. As will be apparent from the voltage-time curves depicted in FIG. 3, only after approximately one-half of the total charging time do there arise significant differences of the voltages with respect to the electrolyte temperature. At a temperature of the electrolyte of 35° C. and a total charging time of 320 minutes the battery, after 80 minutes, in other words, after one-quarter of the charging time, exhibited a potential of 55.9 volts. As can be seen from the diagram of FIG. 3 and also the foregoing explanations, it is thus possible to directly draw conclusions about the charging state from the voltage of the battery during charging.

Figure 4:
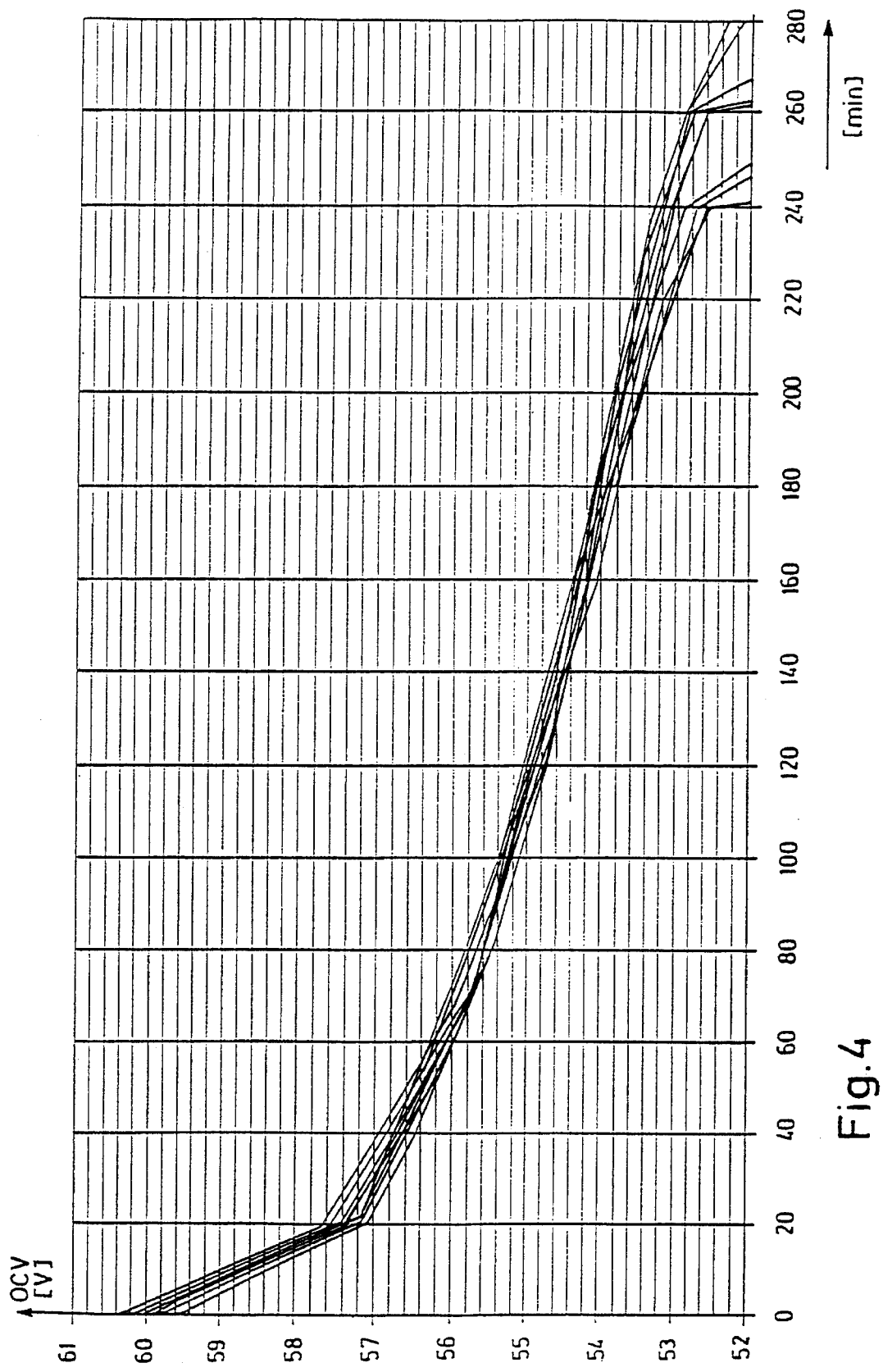

FIG. 4 is a diagram portraying the discharging operation, and specifically, there is illustrated dropping of the battery voltage at an electrolyte temperature of 30° C. in accordance with the first group of curves, which reaches the potential of 52 volts between 240 and 260 minutes, at 35° C. there is shown in accordance with the curves, dropping of the battery voltage to 52 volts between 260 and 280 minutes, and at 40° C. there is shown in accordance with the two curves, dropping of the battery voltage to 52 volts after 280 minutes. The voltage dropping or descent curves were obtained by loading the batteries at corresponding electrolyte temperatures during constant drawing of a current of 25 amperes. As will be especially evident from these curves, a particularly pronounced drop of the voltage occurs within the first 20 minutes and also in the last capacity region there occurs a particularly pronounced dropping of the voltage or potential. Depending upon the temperature of the electrolyte, the starting voltage amounted to between 59.6 and 60.4 volts. After 20 minutes this voltage dropped to 57.1 to 57.7 volts. After removal of about 25% of the ampere-hours the voltage dropped to 56.1 to 55.4 volts. After removal of about one-half of the ampere-hours the battery exhibited a voltage of approximately 54.8 volts. Moreover, as will be further recognized from the showing of FIG. 4, there first occurs a pronounced dropping of the voltage in the last region when there has been removed almost all of the voltage from the battery just as in the aforementioned first time-region of voltage removal.

By virtue of the essentially uniform or steady course of the curves, with the exception of a slight starting and end region, both during charging as well as discharging there can be determined the charging state or condition of the battery throughout a large region or range, and only in the relevant end regions does the temperature, during charging and discharging, cause a certain difference in the voltage of the battery.

A comparison of the curves of FIGS. 3 and 4, in other words, the increase of the voltage during charging with a current of 25 amperes and a reduction of the voltage in the battery at a current removal with 25 amperes, can there be seen that the voltage is not only dependent upon which charging state is present, rather also if the battery is charged or discharged, so that for particularly accurate measurements there also must be taken into account whether there is present a charging or discharging operation. In order to take into account this difference of the dependency of voltage to capacity, depending upon whether there occurs charging or discharging of the battery, there can be provided a separate element which compares the comparison of the voltage in each case in accordance with the charging state and discharging state, respectively.

While there are shown and described present preferred embodiments of the invention, it is distinctly to be understood the invention is not limited thereto, but may be otherwise variously embodied and practiced within the scope of the following claims.

What is claimed is:

1. A method for determining the charging state of a zinc-bromine battery, comprising the steps of:

determining, directly prior to measuring of at least one cell of a rechargeable zinc-bromine battery comprising at least one cell and a plurality of series connected bipolar electrodes and circulating aqueous electrolytes, wherein oxidized bromine ions in conjunction with a complexing agent dissolved in aqueous electrolyte form a complex which is difficult to dissolve in the electrolyte, and zinc is separated at the electrode, and a respective diaphragm is arranged between electrode chambers, whether current is being drawn from or delivered to the at least one cell;

measuring the electrical voltage of the at least one cell; and evaluating the measured electrical voltage.

2. The method according to claim 1, wherein:

the step of determining the electrical voltage comprises determining the electrical voltage of a number of series connected cells of the zinc-bromine battery.

3. The method according to claim 1, wherein:

the step of determining the electrical voltage of at least one cell is carried out during a predetermined discharge of current per predetermined time interval from the cell.

4. The method according to claim 1, wherein:

the step of evaluating the determined electrical voltage includes displaying such evaluated electrical voltage.

5. The method according to claim 1, further including the step of:

comparing the determined electrical voltage with predetermined values, in order to obtain an indication of the amount of stored charge of the battery; and indicating the amount of stored charge of the battery.

6. The method according to claim 5, wherein:

the determination of the amount of stored charge of the battery constitutes an absolute stored quantity of charge.

7. The method according to claim 5, wherein:

the determination of the amount of stored charge of the battery constitutes a relative stored quantity of charge.

8. The method according to claim 1, further including the step of:

comparing a digital value representative of the determined electrical voltage with predetermined values, in order to obtain an indication of the amount of stored charge of the battery; and indicating the amount of stored charge of the battery.

9. The method according to claim 1, wherein:

the step of determining the electrical voltage of at least one cell is determined during discharge of current from the cell under an operating load of the battery.

10. The method according to claim 1, further including the step of:

determining the temperature of each electrolyte; and using the determined electrolyte temperatures in the evaluation of the measured electrical voltage in the determination of the charging state of the battery, so that temperature compensation of the determination of the charging state is applied for electrolyte temperatures above 30° C.

11. The method according to claim 10, wherein the using the determined electrolyte temperatures in the evaluation of the measured electrical voltage in the determination of the charging state of the battery is performed so that temperature compensation of the determination of the charging state is applied for electrolyte temperatures ranging from 30° C. to 40° C.

12. The method according to claim 1, further comprising:
   initiating the measuring the electrical voltage of at least one cell whenever the battery is subjected to a predetermined load range.

13. The method according to claim 1, further comprising:
   initiating the measuring the electrical voltage of at least one cell whenever the battery is subjected to a change in load value which is greater than or equal to a predetermined change in load value.

14. The method according to claim 1, further comprising:
   connecting a charging device to the battery whenever the measured voltage is less than a predetermined voltage value.

15. The method according to claim 1, further comprising:
   interrupting the charging of the zinc-bromine battery only after determining by the evaluation step, that the measured voltage has reached or exceeded a predetermined value.

16. In a method of determining the charging state of a zinc bromine battery having at least one cell and which contains a plurality of series connected bipolar electrodes and circulating aqueous electrolytes, wherein oxidized bromine ions in conjunction with a complexing agent dissolved in aqueous electrolyte form a complex which is difficult to dissolve in the electrolyte and zinc is separated at the electrode, and a respective diaphragm is arranged between electrode chambers, the improvement comprising:
   determining the electrical voltage of at least one cell of the zinc-bromine battery including measuring the electric voltage;
   evaluating the determined electrical voltage; and
   determining directly prior to said measuring of the electrical voltage whether current is being drawn from or delivered to the cell.

* * * * *